United States Patent [19]

Kreibich et al.

[11] Patent Number: 5,014,004
[45] Date of Patent: May 7, 1991

[54] SPRUNG CONTACT PIN FOR TESTING TESTPIECES

[75] Inventors: Ralf Kreibich, Constance; Michael Topp, Friedrichshafen, both of Fed. Rep. of Germany

[73] Assignee: Ingun Prufmittelbau GmbH, Constance, Fed. Rep. of Germany

[21] Appl. No.: 382,391

[22] Filed: Jul. 20, 1989

[51] Int. Cl.⁵ ............................................. G01R 1/06
[52] U.S. Cl. .............................. 324/158 P; 324/72.5; 267/168
[58] Field of Search ............. 324/158 P, 158 F, 72 S, 324/73 PC; 267/168

[56] References Cited

U.S. PATENT DOCUMENTS 3,762,442 10/1973 Paul ..................................... 267/168
3,797,817 3/1974 Deisenroth ......................... 267/168
3,944,196 3/1976 Schwartzkopf ..................... 267/168
4,321,532 3/1982 Luna ................................ 324/158 P

FOREIGN PATENT DOCUMENTS 3801222 7/1989 Fed. Rep. of Germany ... 324/158 P
622103 3/1981 Switzerland .
529569 9/1976 U.S.S.R. .......................... 324/158 P
1028694 2/1963 United Kingdom ................ 267/168

*Primary Examiner*—Ernest F. Karlsen
*Attorney, Agent, or Firm*—Bachman & LaPointe

[57] ABSTRACT

The disclosure teaches a sprung contact pin for testing testpieces, in particular electrical printed circuit boards, including a casing, a coil spring disposed therein, a portion of a testing tip which projects axially out of the casing and which is movable against the force of the coil spring, and at least one further storage means associated with the coil spring.

11 Claims, 1 Drawing Sheet

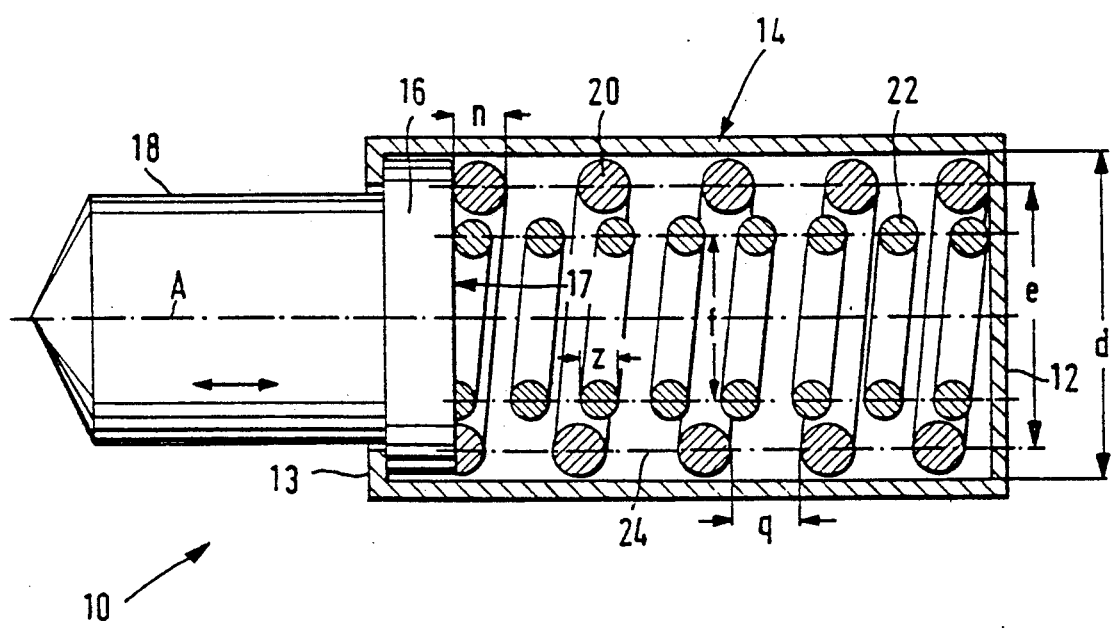

SPRUNG CONTACT PIN FOR TESTING TESTPIECES

The invention relates to a sprung contact pin for testing testpieces, in particular electrical printed circuit boards, comprising a portion, which is movable in a casing against the force of a coil spring disposed therein, of a testing tip which projects axially out of the casing.

A contact pin of that kind is to be found in Swiss patent specification No 622,103, comprising an internal spring which presses against a plunger portion on the testing tip. The coil spring is used to produce the required contact force when the pin comes to bear against an electrical contact. A further function is that of compensating for differences in respect of height of the members to be contacted when a plurality of the sprung contact pins make contact at the same time. That is the situation for example when testing electrical printed circuit boards in a functional test and in the test which is known as the IN-Circuit-Test.

The service life of the spring is an important parameter in regard to the service life of the entire contact pin; when the spring breaks, the contact pin has to be replaced. The material and consequently tensile strength, modulus of elasticity and modulus of shear determine the service life of the spring, as well as the thickness of the wire, the spring diameter, the number of turns and the spring travel. From those items of data it is possible to calculate the shearing stress and the stroke-travel stress which make it possible to have information about the service life of a given spring, by comparison with the theoretically admissible shearing stress and the admissible stroke-travel stress which is ascertained from fatigue strength diagrams.

Being aware of those considerations, the inventor set himself the aim of enhancing the service life of contact pins of the kind set forth in the opening part of this specification, without therewith surrendering simplicity of assembly.

That object is attained in that associated with the coil spring is at least one further force storage means, with the force storage means preferably being in the form of coil springs. In accordance with the invention one of the coil springs has the same outside diameter as the single spring of the previous design principle.

It is particularly advantageous for a second spring to be of such a size that it can be axially inserted into the first spring. The total spring force is the sum of the individual spring forces.

The fact that each of the, preferably, two coil springs is subjected to a lower loading, when considered in itself, than an individual spring, is to be considered as a major advantage of the arrangement of the invention. In accordance with a further feature of the invention the two coil springs are arranged in coaxial relationship within the casing. For that purpose, it has been found to be advantageous for the internal spring to have smaller wire diameter than the outer spring. For, division of the total spring force as between the inner and outer springs is not uniform. The forces are distributed in such a way that the shearing and stroke-travel stresses in the two springs are approximately equal.

The reduction in stresses which is achieved in that way provides for a substantial increase in the service life of the coil springs and therewith the contact pin, by several 100%. That has been demonstrated by suitable in-house tests.

It is in accordance with the invention for the turns of the one spring to extend in opposite relationship to the turns of the other spring: that is to say, in the case involving two springs, one spring is wound in the counter-clockwise direction and the other spring is wound in the clockwise direction, with the choice in regard to the direction of winding being suited to each individual situation. The fact that the springs are wound in opposite directions prevents the springs from hooking into each other.

If the springs can be produced in such a way that the empty space between the individual turns is smaller than the diameter of the wire of the other spring, then the two springs do not necessarily have to be wound in opposite relationship; the risk of the springs becoming hooked into each other is eliminated by the above-indicated relative dimensions.

It has been found that the advantages of the construction principle according to the invention are attained not only when the coil springs are of the same length, but the specified advantages are also achieved when the spring lengths are unequal, due to the geometry of the individual components of a sprung contact pin.

The proposal according to the invention attains the object that the inventor set himself and permits that to be done, in spite of the small amount of space available; the space available has hitherto meant that the spring used was deigned to operate up to the limit of admissible loading or that said limit was exceeded when high spring forces of for example more than 2.5 N were required. That means that in that state of the art the service life of the spring uses was always severely limited.

Further features of the invention are set forth in the subsidiary claims. Further advantages, features and details of the invention will be apparent from the following description of a preferred embodiment and with reference to the drawing showing a view in cross-section through a contact pin 10 on an enlarged scale.

The contact pin for testing electrical circuit boards or the like testpieces, which are not shown for the sake of simplicity of the drawing, comprises a casing 14 provided with a bottom 12 and an annular collar portion 13 which is parallel thereto, the inside diameter d of the casing 14 being 1.35 mm in this case, and a piston 16 which is disposed in the casing 14 and which carries a testing tip 18 which is in one piece therewith. The testing tip 18 is movable with the piston 16 on the longitudinal axis A of the contact pin 10 between the bottom 12 and the annular collar portion 13.

An outer coil spring 20 of a mean spring diameter e in this embodiment of 1.1 mm bears against the bottom 12 of the casing 14 on the one hand, which is possibly also in the form of a ring portion, and a flat, curved or conical end face 17 of the piston 16 on the other hand. The outer coil spring 20 coaxially surrounds an inner spring 22 with a spring diameter f of 0.7 mm.

The wire or cross-section diameter n of the outer spring 20 is greater than the cross-section diameter z of the inner spring 22. The length q of the spaces 24 between the cross-sections of adjacent turns of the outer spring 20 in the rest position thereof is in this case greater than the wire diameter z of the smaller inner spring 22.

The turn of the inner spring 22 may if desired be directed in opposite relationship to those of the outer spring 20.

We claim:

1. A spring contact pin for testing electrical components, comprising a casing, a coil spring disposed therein, a testing tip disposed within said casing, a portion of said testing tip projecting axially out of the casing, wherein said testing tip is carried by and is moveable with a piston disposed in the casing, said piston and tip being moveable against the force of said coil spring and at least one further force storage means associated with the coil spring for enhancing the service life of said contact pin wherein the total force against which the tip and piston is moveable is the sum of the force of the coil spring and the further force storage means.

2. A contact pin has set forth in claim 1 wherein the coil spring disposed in the casing is a first coil spring and the further force storage means comprises a second coil spring disposed in the interior of said first coil spring.

3. A contact pin as set forth in claim 1 wherein both the force storage means and coil spring are arranged in coaxial relationship within the casing.

4. A contact pin as set forth in claim 2 wherein the turns of the first coil spring extend in the opposite direction of the turns of the second coil spring.

5. A contact pin as set forth in claim 2 wherein the empty space between two adjacent cross-sections of the first coil spring in a rest position is greater than the wire cross-section diameter of the second coil spring, and wherein the turns of the second coil spring extend in the opposite direction to those of the first coil spring.

6. A contact pin as set forth in claim 2 wherein the shearing and stroke-travel stresses of the springs are approximately the same.

7. A contact pin as set forth in claim 1 wherein said casing includes a bottom wall and an annular collar portion opposed to said bottom wall and wherein the coil spring and force storage means are disposed between said piston and said bottom wall.

8. A contact pin as set forth in claim 2 wherein the empty space between two adjacent cross-sections of the first coil spring in a rest position is shorter than the wire cross-section diameter of the second coil spring, and wherein the two coil springs are wound in the same direction.

9. A contact pin as set forth in claim 2 wherein the first coil spring has a mean spring diameter and the second coil spring has a mean spring diameter, and wherein the mean spring diameter of the first coil spring is greater than the mean spring diameter of the second coil spring.

10. A contact pin as set forth in claim 8, wherein the wire cross-section diameter of the first coil spring is greater than the wire cross-section diameter of the second coil spring.

11. A contact pin as set forth in claim 5 wherein the wire cross-section diameter of the first coil spring is greater than the wire cross-section diameter of the second coil spring.

* * * * *